(12) United States Patent
Lee

(10) Patent No.: US 7,629,829 B2
(45) Date of Patent: Dec. 8, 2009

(54) PHASE MIXING DEVICE FOR USE IN DUTY CYCLE CORRECTION

(75) Inventor: Hyun Woo Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 31 days.

(21) Appl. No.: 11/837,632

(22) Filed: Aug. 13, 2007

(65) Prior Publication Data

US 2008/0001643 A1   Jan. 3, 2008

Related U.S. Application Data

(62) Division of application No. 11/477,080, filed on Jun. 28, 2006, now Pat. No. 7,282,977.

(30) Foreign Application Priority Data

Jun. 30, 2005   (KR) .................. 10-2005-0058090

(51) Int. Cl.
    G06F 1/04 (2006.01)
(52) U.S. Cl. ............... 327/298; 327/175; 327/294; 327/355; 327/407; 327/410
(58) Field of Classification Search ............ 327/99, 327/172–175, 294, 298, 355–358, 360, 361, 327/407–413
    See application file for complete search history.

(56) References Cited

U.S. PATENT DOCUMENTS

| | | | |
|---|---|---|---|
| 5,945,862 A | 8/1999 | Donnelly et al. | |
| 6,125,157 A | 9/2000 | Donnelly et al. | |
| 6,452,432 B2 | 9/2002 | Kim | |
| 6,573,771 B2 | 6/2003 | Lee et al. | |
| 6,677,792 B2 * | 1/2004 | Kwak | 327/158 |
| 6,853,225 B2 | 2/2005 | Lee | |
| 6,982,578 B2 * | 1/2006 | Lee | 327/158 |
| 7,046,059 B2 * | 5/2006 | Kwak | 327/158 |
| 7,142,026 B2 * | 11/2006 | Kwak | 327/158 |
| 7,274,236 B2 * | 9/2007 | Lee | 327/261 |
| 7,282,977 B2 * | 10/2007 | Lee | 327/175 |
| 7,368,966 B2 * | 5/2008 | Hur | 327/175 |

(Continued)

FOREIGN PATENT DOCUMENTS

KR   2005-0055925   6/2005

*Primary Examiner*—Lincoln Donovan
*Assistant Examiner*—Patrick O'Neill
(74) *Attorney, Agent, or Firm*—Ladas & Parry LLP

(57) ABSTRACT

Disclosed is a duty cycle correction device for correcting a duty cycle of a clock signal output from a delay locked loop circuit. The duty cycle correction device includes a mixer for mixing phases of the first and second clock signals, thereby outputting a first signal, a phase splitter receiving the first signal and outputting a third clock signal, a duty detection unit receiving the third and fourth clock signals to detect a difference between duty cycles of the third and fourth clock signals, a combination unit for outputting a second signal, a shift register for outputting a first control signal, a phase detection unit receiving the first and second clock signals and outputting a second control signal representing a difference between duty cycles of the first and second clock signals. The mixer adjusts a mixing ratio by using the first and second control signals.

6 Claims, 8 Drawing Sheets

U.S. PATENT DOCUMENTS

| | | | |
|---|---|---|---|
| 7,428,286 B2 * | 9/2008 | Kim | 375/371 |
| 2003/0219088 A1 | 11/2003 | Kwak | |
| 2005/0110539 A1 * | 5/2005 | Lee | 327/158 |
| 2007/0200604 A1 * | 8/2007 | Yun et al. | 327/158 |
| 2007/0262798 A1 * | 11/2007 | Yun et al. | 327/158 |
| 2008/0174350 A1 * | 7/2008 | Shin et al. | 327/158 |

\* cited by examiner

FIG.6B

SHIFT RIGHT OPERATION | 1 | 0 | 0 | 0 | 0 | 0 | 0 | 0 |

FIG.6C

SHIFT RIGHT OPERATION | 1 | 1 | 0 | 0 | 0 | 0 | 0 | 0 |

FIG.6D

SHIFT LEFT OPERATION | 1 | 0 | 0 | 0 | 0 | 0 | 0 | 0 |

FIG.6E

AFTER THREE SHIFT RIGHT OPERATIONS | 1 | 1 | 1 | 1 | 0 | 0 | 0 | 0 |

PHASE MIXING DEVICE FOR USE IN DUTY CYCLE CORRECTION

BACKGROUND OF THE INVENTION

1. Field of the Invention

The present invention relates to a duty cycle correction device used for a semiconductor memory chip. More particularly, the present invention relates to a duty cycle correction device for correcting a duty cycle of a clock signal output from a delay locked loop (DLL) circuit by using a phase mixer.

2. Description of the Prior Art

As generally known in the art, a DLL circuit is a clock generation device, which is accommodated in a synchronous memory device so as to compensate for skew between an external clock and an internal clock. Synchronous memory devices, such as DDR, DDR2, etc., control the timing for input/output operations in synchronization with an internal clock output from a DLL circuit. In the case of these synchronous memory devices, since data are input/output in synchronization with the rising and falling edges of an external clock, it is preferred if the duty cycle of an internal clock output from a DLL circuit is set as 50%. In order to adjust the duty cycle of an internal clock output from the DLL circuit to a level of approximately 50%, a duty cycle correction (DCC) device employing a delay circuit or the like is typically used.

However, the conventional DCC device, which employs the delay circuit or the like in order to adjust the duty cycle of an internal clock output from a DLL circuit, has a problem in that the correcting ability for the duty cycle is very poor.

SUMMARY OF THE INVENTION

Accordingly, the present invention has been made to solve the above-mentioned problem occurring in the prior art, and an object of the present invention is to provide a duty cycle correction device capable of generating clock signals having a duty cycle of 50% by mixing phases of two clock signals output from a delay locked loop (DLL) circuit and controlling a phase mixer using the mixed result.

In order to accomplish this object, according to one aspect of the present invention, there is provided a duty cycle correction device comprising: a mixer for receiving first and second clock signals having rising edges synchronized with each other and mixing phases of the first and second clock signals, wherein a duty cycle of a signal output from the mixer is determined according to a mixing ratio of the mixer.

According to the preferred embodiment of the present invention, the duty cycle correction device further comprises a control unit for controlling the mixing ratio of the mixer based on the duty ratio of the signal output from the mixer until a signal having a predetermined duty cycle is output from the mixer.

According to another aspect of the present invention, there is provided a duty cycle correction device comprising: a mixer receiving a first clock signal and a second clock signal and mixing phases of the first and second clock signals, thereby outputting a first signal; a phase splitter receiving the first signal and outputting a third clock signal by delaying the first signal for a predetermined period of time and a fourth clock signal by delaying and inverting the first signal for a predetermined period of time; a duty detection unit receiving the third and fourth clock signals and detecting a difference between duty cycles of the third and fourth clock signals; a combination unit for outputting a second signal by combining an output signal of the duty detection unit and previously-stored output signals; a shift register for outputting a first control signal to adjust a mixing ratio of the first and second clock signals, applied to the mixer in response to the second signal; and a phase detection unit receiving the first and second clock signals and outputting a second control signal representing a difference between duty cycles of the first and second clock signals, wherein the mixer adjusts a mixing ratio by using the first and second control signals.

According to the preferred embodiment of the present invention, a rising edge of the first clock signal is synchronized with a rising edge of the second clock signal.

The mixer comprises a first mixing unit for receiving and mixing the first and second clock signals, a mixing ratio of the first mixing unit being controlled according to the second control signal; and a second mixing unit selectively receiving and mixing the first and second clock signals in response to the first control signal, wherein output terminals of the first and second mixing units are connected to each other.

The first mixing unit includes a first inverter group having N inverters, which are connected between a first node and a second node in a row; a second inverter group having N inverters, which are connected between a third node and the second node in a row; and a buffer connected between the second node and a fourth node, and the second mixing unit includes a first inverter connected between the first node and a fifth node; a second inverter connected between the third node and the fifth node; and a plurality of third inverters connected between the fifth node and the fourth node in a row, wherein the first clock signal is applied to the first node, the second clock signal is applied to the third node and the first signal is output through the fourth node.

The phase splitter comprises an even number of inverters connected to each other in series so as to receive the first signal and to output the third clock signal by delaying the first signal for a predetermined period of time; and an odd number of inverters connected to each other in series so as to receive the first signal and to output the fourth clock signal by delaying the first signal for a predetermined period of time.

In addition, the duty detection unit detects a difference between high-level sections of the third and fourth clock signals.

BRIEF DESCRIPTION OF THE DRAWINGS

The above and other objects, features and advantages of the present invention will be more apparent from the following detailed description taken in conjunction with the accompanying drawings, in which:

FIG. 1b is a view illustrating waveforms of signals shown in FIG. 1a;

FIGS. 6a to 6e are views for explaining the operation of a shift register; and

DETAILED DESCRIPTION OF THE PREFERRED EMBODIMENTS

Figure 1A:
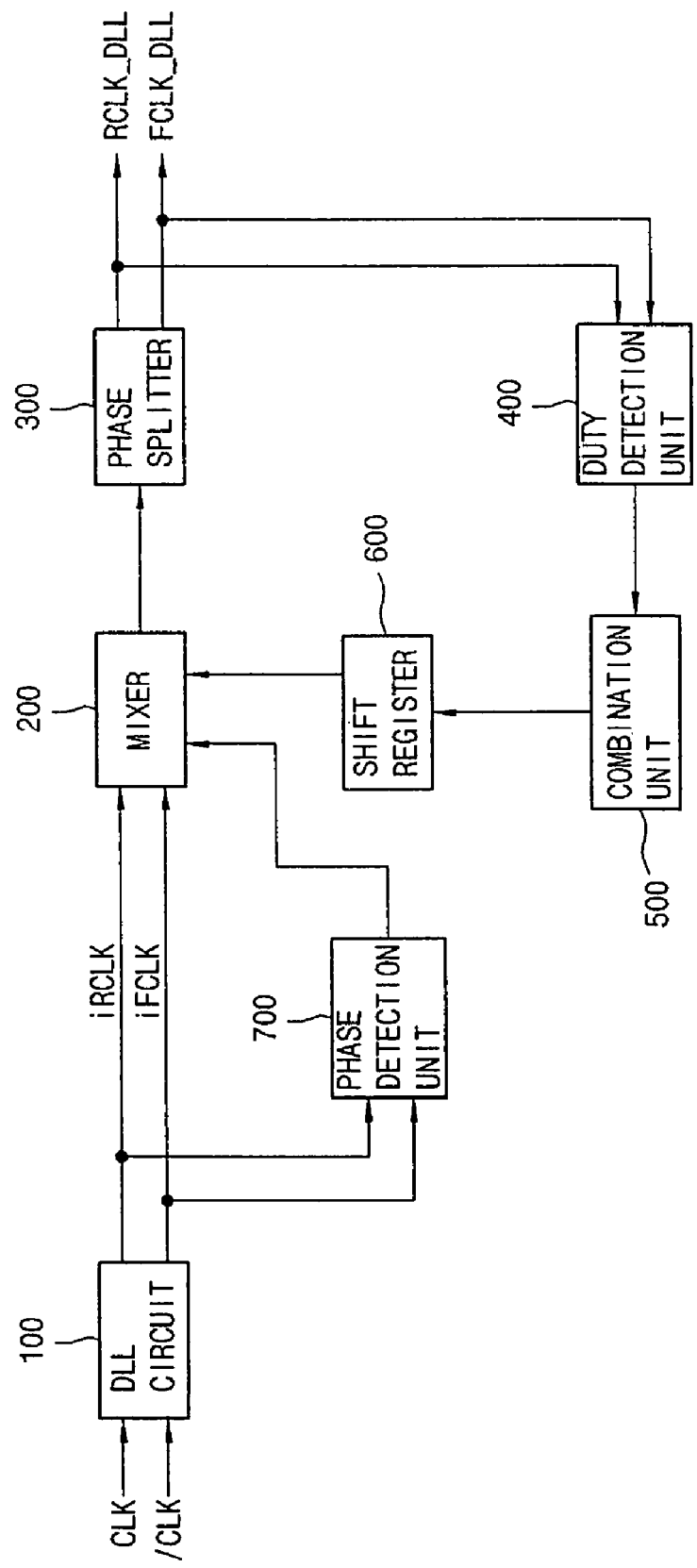
FIG. 1a is a view illustrating the structure of a duty cycle correction device according to an embodiment of the present invention.

Hereinafter, a preferred embodiment of the present invention will be described with reference to the accompanying drawings. In the following description and drawings, the same reference numerals are used to designate the same or similar components, so repetition of the description on the same or similar components will be omitted.

FIG. 1a is a view illustrating the structure of a duty cycle correction device according to an embodiment of the present invention.

As shown in FIG. 1a, the duty cycle correction device includes a mixer 200 for receiving signals "iRCLK" and "iFCLK" output from a delay locked loop (DLL) circuit 100, a phase splitter 300 for receiving an output signal of the mixer 200 and outputting signals "RCLK_DLL" and "FCLK_DLL" having a corrected duty-cycle, a duty detection unit 400 for detecting the duty cycles of the signals "RCLK_DLL" and "FCLK_DLL" output from the phase splitter 300, a combination unit 500 for receiving an output signal of the duty detection unit 400 and combining phase distortion, a shift register 600 for controlling a mixing degree of the mixer 200 in response to an output signal of the combination unit 500, and a phase detection unit 700 for controlling a weight factor by comparing phases of signals "iRCLK" and "iFCLK" output from the DLL circuit 100.

Figure 1B:
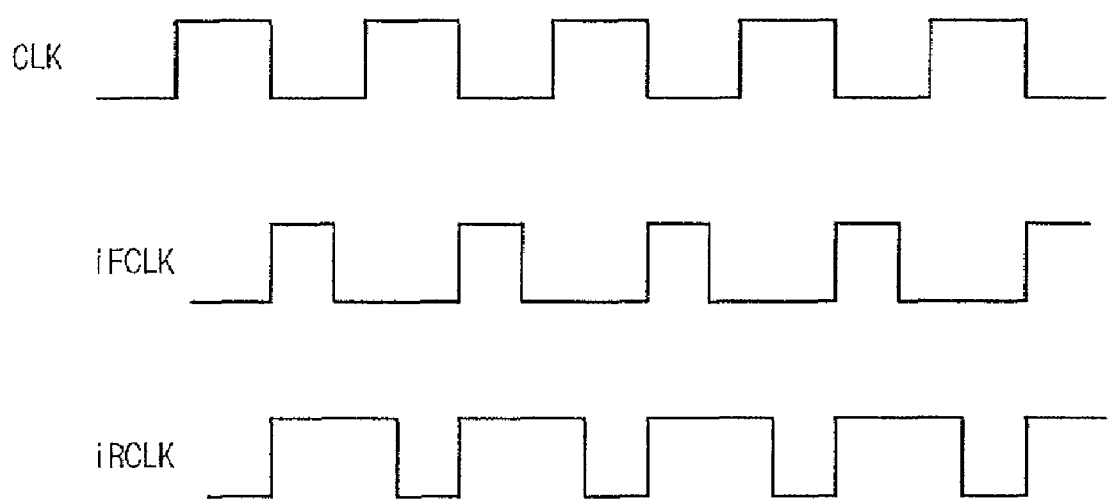

The DLL circuit 100 receives external clocks "CLK" and "/CLK" and outputs internal clocks "iRCLK" and "iFCLK". Herein, it is necessary to pay attention to the waveform of a signal output from the DLL circuit 100. The internal clock "iRCLK" is a clock signal synchronized with the rising edge of the external clock "CLK" and the internal clock "iFCLK" is a clock signal having a duty cycle different from that of the internal clock "iRCLK". The internal clock "iFCLK" is synchronized with the rising edge of the external clock "CLK". For reference, FIG. 1b is a view illustrating waveforms of the output signals of the DLL circuit 100. The duty cycle correction device according to the present invention is applicable for a circuit capable of outputting two input signals, whose rising edges are synchronized with each other but duty cycles thereof are different from each other.

The mixer 200 includes a first mixing unit 210, a second mixing unit 220 and a control signal generation unit 230. A mixing ratio between the first and second mixing units 210 and 220 is controlled according to control signals "ME1, ME1b, ME2, ME2b, ME3 and ME3b" output from the control signal generation unit 230.

Figure 2:
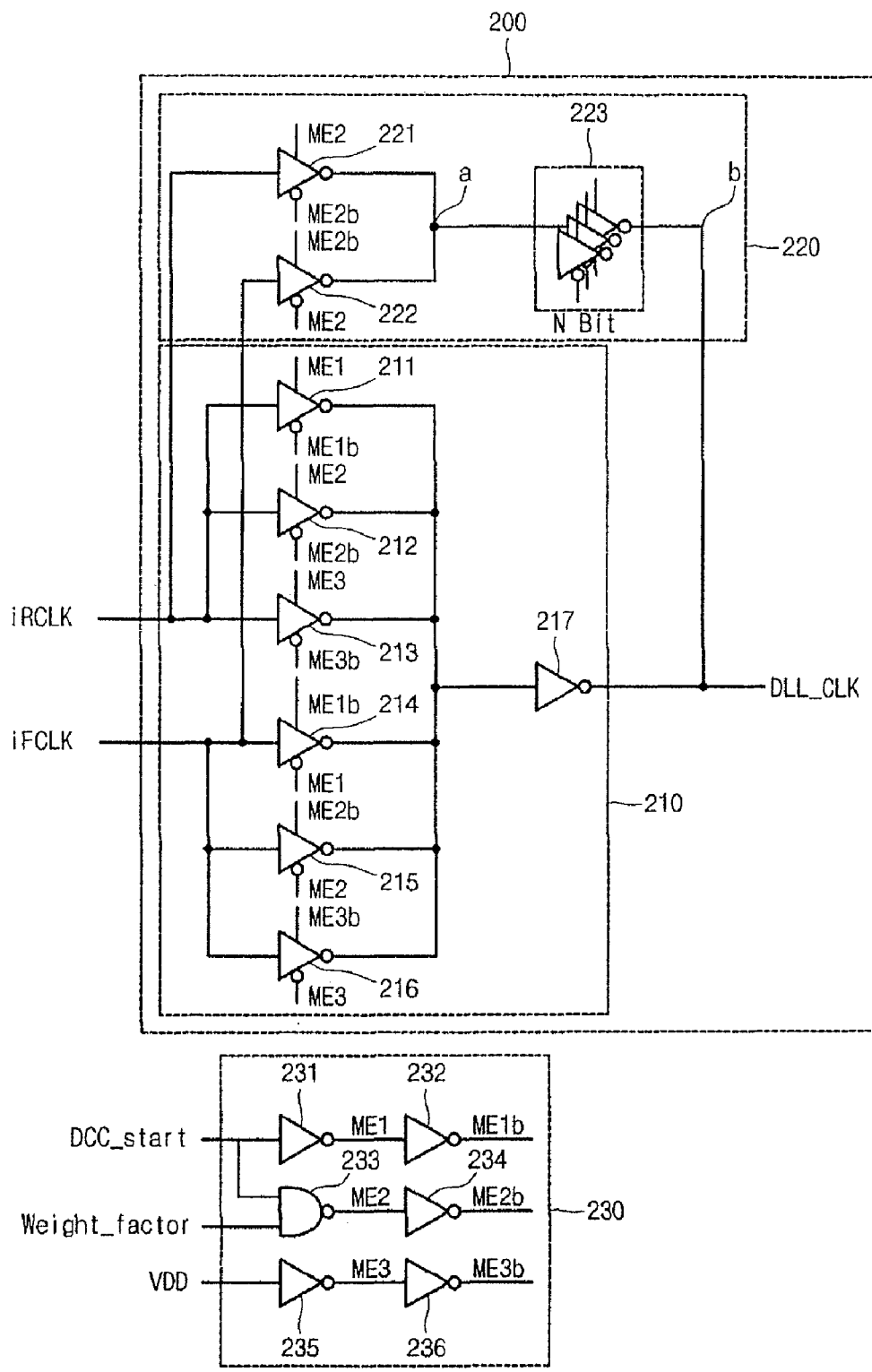
FIG. 2 is a circuit diagram illustrating the structure of a mixer according to an embodiment of the present invention.

As shown in FIG. 2, the first mixing unit 210 includes a plurality of first inverters 211, 212 and 213 for receiving the internal clock "iRCLK", a plurality of second inverters 214, 215 and 216 for receiving the internal clock "iFCLK", and a buffer 217 for receiving output signals of the first and second inverters 211 to 216. Herein, output terminals of the first and second inverters 211 to 215 are commonly connected. The inverter 211 is enabled when the control signal ME1 is a high level and is disabled when the control signal ME1 is a low level. The inverter 212 is enabled when the control signal ME2 is a high level and is disabled when the control signal ME2 is a low level. The inverter 213 is enabled when the control signal ME3 is a high level and is disabled when the control signal ME3 is a low level. The inverter 214 is enabled when the control signal ME1b is a high level and is disabled when the control signal ME1b is a low level. The inverter 215 is enabled when the control signal ME2b is a high level and is disabled when the control signal ME2b is a low level. The inverter 216 is enabled when the control signal ME3b is a high level and is disabled when the control signal ME3b is a low level. Herein, the control signals ME1b, ME2b and ME3b are inverse signals of the control signals ME1, ME2 and ME3, respectively.

The second mixing unit 330 includes a third inverter 221 for receiving the clock signal "iRCLK", a fourth inverter 222 for receiving the clock signal "iFCLK", and a plurality of fifth inverters 223 connected between a common output terminal "a" of the third and fourth inverters 221 and 222 and an output terminal "b" of the buffer 217 in a row. The output signal DLL_CLK of the mixer 200 is output through the output terminal "b" of the buffer 217.

The inverter 221 is enabled when the control signal ME2 is a high level and is disabled when the control signal ME2 is a low level. The inverter 222 is enabled when the control signal ME2b is a high level and is disabled when the control signal ME2b is a low level. The inverters 223 are selectively enabled or disabled according to an output signal of the shift register 600, which will be described later.

The control signal generation unit 230 generates control signals "ME1, ME1b, ME2, ME2b, ME3 and ME3b" applied to the first and second mixing units 210 and 220. As shown in FIG. 2, an inverter 231 receives a signal "DCC_start" and outputs the control signal ME1, and an inverter 232 receives the control signal ME1 and outputs the control signal ME1b. Herein, the signal "DCC_start" is an enable signal, which is output with a low level before the duty cycle correction device shown in FIG. 1a is operated and is shifted into a high level after the duty cycle correction device is operated. A NAND gate 233 receives signals "DCC_start" and "Weight_factor" and outputs the control signal ME2. An inverter 234 receives the control signal ME2 and outputs the control signal ME2b. Herein, the signal "Weight_factor" is an output signal of the phase detection unit 700, which will be described later in detail. An inverter 235 receives a supply voltage VDD and outputs the control signal ME3b and an inverter 236 receives the control signal ME3b and outputs the control signal ME3.

During the operation, the inverters can be selectively enabled or disabled according to the control signals "ME1, ME1b, ME2, ME2b, ME3 and ME3b" applied to the inverters 211 to 216, so that it is possible to mix the phases of clock signals "iRCLK and iFCLK" applied to the mixer. The mixing degree is adjustable by controlling the number of inverters. For reference, in the initial stage of the operation, the inverters 223 controlled by the shift register 600 are disabled, so that only the first mixing unit 210 may operate (see, FIG. 6).

In the initial operation, the signal "DCC_start" is a low level, so that the control signals ME1 and ME2 are high levels and the control signals ME1b and ME2b are low levels.

Thus, the inverters 211, 212 and 213 are enabled and the inverters 214, 215 and 216 are disabled in the initial operation. As a result, the first mixing unit 210 mixes the clock signals "iRCLK and iFCLK" during the initial operation.

Then, if the DCC device is operated, the signal DCC_start is shifted into the high level. Thus, the control signal ME1 is shifted into the low level and the control signal ME1b is shifted into the high level. The logic level of the control signals ME2 and ME2b is determined according to the signal "Weight_factor". That is, if the signal "Weight_factor" is a low level, the control signal ME2 is a high level and the control signal ME2b is a low level. For reference, the signal "Weight_factor" maintains the low level during the operation of the DCC device.

Accordingly, the inverters 212, 213 and 214 of the first mixing unit 210 are enabled and the remaining inverters 211, 215 and 216 are disabled. In this state, the first mixing unit 210 mixes the clock signals "iRCLK and iFCLK".

Figure 3:
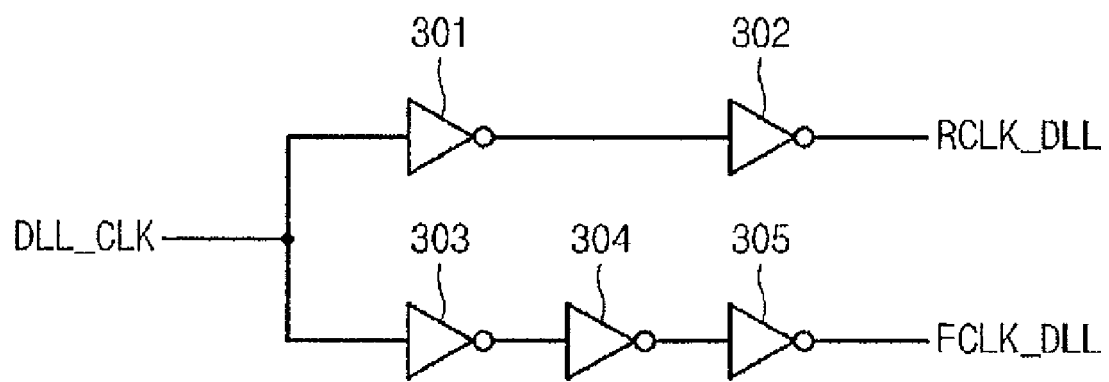
FIG. 3 is a circuit diagram illustrating the structure of a phase splitter according to an embodiment of the present invention.

The phase splitter 300 is a circuit, which receives and buffers the output signal of the mixer 200 and then outputs a clock signal having a duty cycle of 50% that is suitable for use in a semiconductor device. FIG. 3 is a view illustrating the structure of the phase splitter according to an embodiment of the present invention. Referring to FIG. 3, the phase splitter 300 includes first buffers 301 and 302 including an even number of inverters, and second buffers 303, 304, and 305 including an odd number of inverters. The output signal "RCLK_DLL" of the first buffers 301 and 302 is obtained by delaying an input signal "DLL_CLK" for a predetermined period of time, and the output signal "FCLK_DLL" of the second buffers 303, 304, and 305 is obtained by inverting and delaying the input signal "DLL_CLK" for a predetermined period of time. For reference, the time delay caused when the input signal "DLL_CLK" passes through the first buffers 301 and 302 is equal to the time delay caused when the input signal "DLL_CLK" passes through the second buffers 303, 304, and 305.

Figure 4:
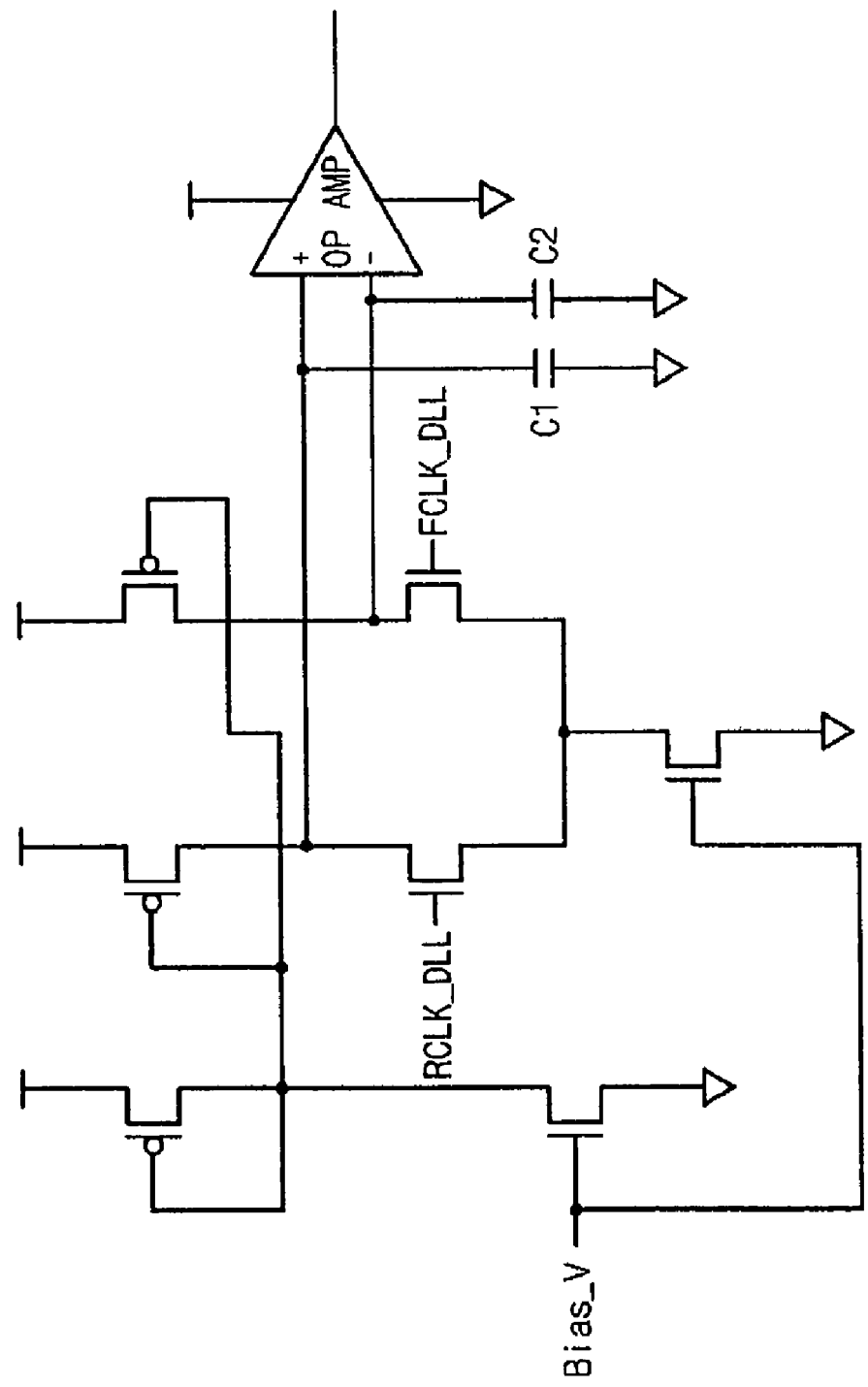
FIG. 4 is a circuit diagram illustrating the structure of a duty detection unit according to an embodiment of the present invention.
Figure 5:
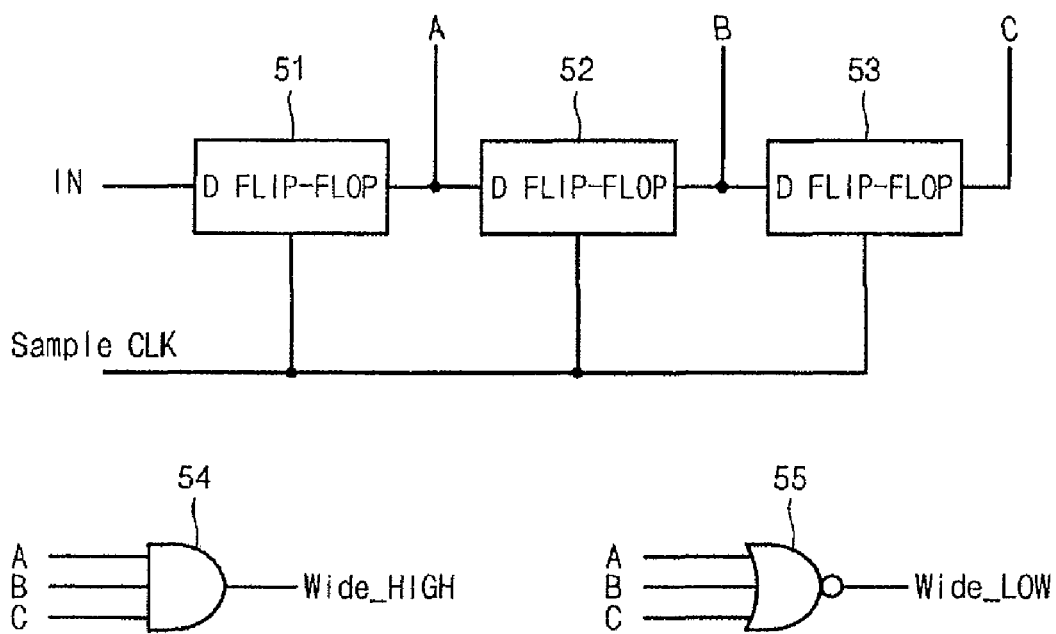
FIG. 5 is a circuit diagram illustrating the structure of a combination unit according to an embodiment of the present invention.

The duty detection unit 400 detects a phase difference between the two output signals "RCLK_DLL" and "FCLK_DLL" of the phase splitter 300. FIG. 4 is a view illustrating the structure of the duty detection unit 400 according to an embodiment of the present invention. As shown in FIG. 4, the duty detection unit 400 includes a differential amplifier for receiving the signals "RCLK_DLL" and "FCLK_DLL", capacitors C1 and C2 for storing output signals of the differential amplifier, and an OP amplifier for amplifying a voltage difference between the capacitors C1 and C2. For reference, a signal "Bias_V" is used to turn on transistors T1 and T2 in order to utilize the transistors T1 and T2 as resistance components. That is, the transistors T1 and T2 may serve as resistance components when they are turned on.

During the operation, the amount of charge stored in the capacitors C1 and C2 may vary depending on the width of high-level sections of the output signals "RCLK_DLL" and "FCLK_DLL" of the phase splitter 300 (for reference, it is preferred if the capacitors C1 and C2 have the same capacity). The difference in the amount of charge results in a difference in an input voltage applied to the OP amplifier. Therefore, the OP amplifier amplifies the voltage difference, thereby detecting a wider one from between high-level sections of two input signals "RCLK_DLL" and "FCLK_DLL". For example, when the two input signals "RCLK_DLL" and "FCLK_DLL" have the same duty cycle, substantially the same amount of charge is stored in the capacitors C1 and C2. In contrast, if the two input signals "RCLK_DLL" and "FCLK_DLL" have duty cycles different from each other, the amount of charge stored in the capacitor Cl is different from that of the capacitor C2. In this case, the OP amplifier detects a difference in the amount of charge of the capacitors C1 and C2, which are connected to input terminals of the OP amplifier, respectively, thereby detecting a difference in duty cycles of the input signals "RCLK_DLL" and "FCLK_DLL".

The combination unit 500 includes a first D flip-flop 51 for receiving an output signal "out" of the duty detection unit 400, a second D flip-flop 52 for receiving an output signal "A" of the first D flip-flop 51, a third D flip-flop 53 for receiving an output signal "B" of the second D flip-flop 52, an AND gate 54 for receiving output signals "A, B and C" of the first to third D flip-flops 51 to 53, and a NOR gate 55 for receiving output signals "A, B and C" of the first to third D flip-flops 51 to 53, respectively. A clock signal "CK" applied to the D flip-flops 51, 52, and 53 is an enable signal for the D flip-flops 51, 52, and 53. For reference, when the AND gate 54 outputs a high-level signal, the shift register is shifted in the right or left direction. In contrast, if the AND gate 54 outputs a low-level signal, the shift register is not shifted. Also, when the NOR gate 55 outputs a low-level signal, the shift register is not shifted. In contrast, when the NOR gate 55 outputs a high-level signal, the shift register is shifted. In this case, the shifting direction of the shift register is opposite to the shifting direction of the shift register caused by an output signal of the AND gate. For instance, if the AND gate controls the shift-left operation, the NOR gate controls a shift-right operation.

Figure 6A:
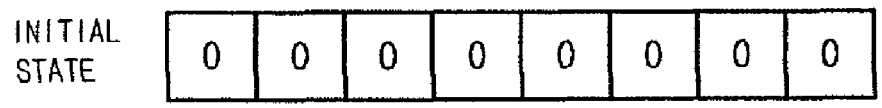

In the initial stage of the operation, the output signals "A", "B", and "C" of the D flip-flops 51, 52, and 53 have values of "L", "L", and "L". Therefore, the output signal of the AND gate 54 has a low level, and the output signal of the NOR gate 55 has a high level. That is, the logic value of the shift register shown in FIG. 6a is shifted in the right direction (see, FIG. 6b).

If a high-level signal "H" is applied from the duty detection unit, the output signals "A", "B", and "C" of the D flip-flops 51, 52, and 53 are changed into "H", "L", and "L", respectively. Thus, the output signals of the AND gate and the NOR gate also have low levels, so that the current state of the shift register is maintained.

In this state, when a high-level signal "H" is applied from the duty detection unit, the output signals "A", "B", and "C" of the D flip-flops 51, 52, and 53 are changed to "H", "H", and "L", respectively. Thus, the output signals of the AND gate and the NOR gate also have low levels, so that the current state of the shift register is maintained.

After that, when a high-level signal "H" is again applied from the duty detection unit, the output signals "A", "B", and "C" of the D flip-flops 51, 52, and 53 are changed to "H", "H", and "H", respectively. Thus, the output signal of the AND gate has a high level and the output signal of the NOR gate has a low level, so that the shift register performs a shift-left operation.

FIGS. 6a to 6e are views for explaining the operation of the shift register 600 according to an embodiment of the present invention. In FIGS. 6a to 6e, 8 bit logic values may serve as control signals corresponding to the inverters 223 shown in FIG. 2.

FIG. 6a shows an initial state, in which the inverters 223 are disabled.

FIG. 6b shows a state after the shift-right operation is performed one time, and FIG. 6c shows a state after the shift-right operation is again performed one time. FIG. 6d shows a state after the shift-left operation is performed one time, and FIG. 6e shows a state after the shift-right operation is performed three times.

FIG. 6a shows the output signal of the shift register in the initial stage of the operation. Thus, the inverters 223 shown in FIG. 2 are disabled. Thereafter, the shifting operation is performed according to signals applied from the combination unit and the inverters 223 are selectively enabled/disabled according to the logic values of the shift register, which has been changed through the shifting operation of the shift register. That is, the inverters shown in FIG. 2 can be selectively enabled/disabled according to the logic values of the shift register. Therefore, it is possible to adjust a mixing ratio of signals "iRCLK" and "iFCLK" applied to the mixer 200.

When a mixing ratio close to the optimum state is set by output signals of the shift register, the output signal "DCC_CLK" of the mixer 200 has a duty cycle of approximately 50%. Therefore, the output signals "RCLK_DLL" and "FCLK_DLL" of the phase splitter 300 also have a duty cycle of approximately 50%. That is, the mixing ratio of the mixer 200 is re-adjusted according to the output signal of the shift register and the above-mentioned procedure is continuously repeated.

Figure 7A:
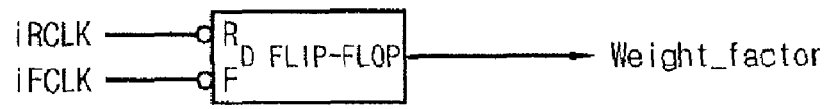
FIGS. 7a to 7c are views illustrating signal generation circuits, respectively.
Figure 7B:
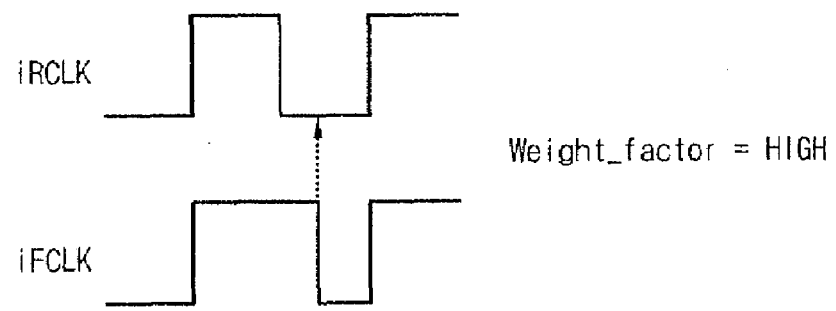
Figure 7C:
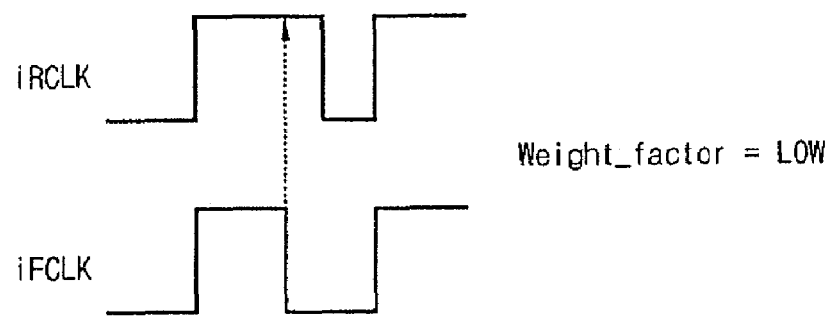

FIG. 7a is a view illustrating the structure of the phase detection unit 700 according to an embodiment of the present invention, and FIGS. 7b and 7c are views illustrating the procedure for determining the logic values of the output signal (Weight_factor).

As shown in FIGS. 7a to 7c, the phase detection unit 700 shown in FIG. 7a includes a D flip-flop for receiving clock signals "iRCLK and iFCLK". For reference, an F terminal of the D flip-flop receives an inverse signal of the clock signal "iFCLK" and an R terminal of the D flip-flop receives an inverse signal of the clock signal "iRCLK". A logic level value of the inverse signal of the clock signal "iRCLK", which is applied to the R terminal in synchronization with the rising edge of the inverse signal of the clock signal "iFCLK" applied to the F terminal, is output as a signal "Weight_factor".

In the operation, at the falling edge of the clock signal "iFCLK" (that is, the rising edge of the inverse signal of the clock signal "iFCLK"), if the clock signal "iRCLK" has the low level (that is, if the inverse signal of the clock signal "iRCLK" has the high level), the output signal "Weight_factor" of the phase detection unit has the high level (see, FIG. 7b).

In contrast, at the falling edge of the clock signal "iFCLK" (that is, the rising edge of the inverse signal of the clock signal "iFCLK"), if the clock signal "iRCLK" has the high level (that is, if the inverse signal of the clock signal "iRCLK" has the low level), the output signal "Weight_factor" of the phase detection unit has the low level (see, FIG. 7c).

When the output signal "Weight_factor" has the high level, the high level section of the clock signal "iRCLK" is narrower than the high level section of the clock signal "iFCLK". If the signal "Weight_factor" has the high level, the control signal generation unit 230 (see, FIG. 2) receiving the signal "Weight_factor" outputs the control signal ME2 having the low level. Accordingly, the inverter 221 of the second mixing unit 220 is disabled and the inverter 222 of the second mixing unit 220 is enabled. As a result, the clock signal "iFCLK" passes through the inverter 222 and is mixed by means of the inverters 223. The output signals of the inverters are mixed with the output signal of the first mixing unit 210 one more time. As a result, the mixing result of the first mixing unit may become further accurate by means of the second mixing unit. For reference, the number of enabled inverters 223 depends on the output signal of the shift register. The mixing ratio can be adjusted by controlling the number of enabled inverters 223 which are connected in a row. As can be understood from the above, if the high level section of the clock signal "iRCLK" is narrower than the high level section of the clock signal "iFCLK", the clock signal which is mixed in the first mixing unit 210 and output to the inverter 217 is mixed with the clock signal "iFCLK" passing through the second mixing unit 220 one time. Thus, the signal DLL_CLK has the duty cycle of approximately 50%.

Meanwhile, when the output signal "Weight_factor" has the low level, the high level section of the clock signal "iRCLK" is wider than the high level section of the clock signal "iFCLK". If the signal "Weight_factor" has the low level, the control signal generation unit 230 (see, FIG. 2) receiving the signal "Weight_factor" outputs the control signal ME2 having the high level. Accordingly, the inverter 221 of the second mixing unit 220 is enabled and the inverter 222 of the second mixing unit 220 is disabled. As a result, the clock signal "iRCLK" passes through the inverter 221 and is mixed by means of the inverters 223. The output signals of the inverters are mixed with the output signal of the first mixing unit 210 one more time. Here, the number of enabled inverters 223 depends on the output signal of the shift register. As can be understood from the above, if the high level section of the clock signal "iRCLK" is wider than the high level section of the clock signal "iFCLK", the clock signal which is mixed in the first mixing unit 210 and output to the inverter 217 is mixed with the clock signal "iRCLK" passing through the second mixing unit 220 one time. Thus, the signal DLL_CLK has the duty cycle of approximately 50%.

The above-described mixing procedure may continuously repeat. As a result, the clock signals "iRCLK" and "iFCLK" shown in FIGS. 7b and 7c are changed into clock signals having the duty cycle of approximately 50%. That is, the duty cycle of the signal DLL_CLK may close to 50%.

As described above, the duty cycle correction apparatus according to the present invention can generate the clock signal having the duty cycle of approximately 50% within a short period of time.

Although a preferred embodiment of the present invention has been described for illustrative purposes, those skilled in the art will appreciate that various modifications, additions and substitutions are possible, without departing from the scope and spirit of the invention as disclosed in the accompanying claims.

The invention claimed is:

1. A phase mixing device comprising:
a first mixing unit for receiving and mixing a first and a second clock signal, and controlling a mixing ratio of the first and second clock signals according to a second control signal; and
a second mixing unit for selecting one of the first and second clock signals in response to a first control signal and adjusting a phase of the selected clock signal in response to a third control signal, wherein output terminals of the first and second mixing units are connected to each other.

2. The phase mixing device as claimed in claim 1, wherein the first and second clock signals are synchronized with each other.

3. The phase mixing device as claimed in claim 2, wherein the first mixing unit comprises:
a first inverter group having N inverters, which are connected between a first node and a second node in a row;
a second inverter group having N inverters, which are connected between a third node and the second node in a row; and
a buffer connected between the second node and a fourth node, and the second mixing unit comprises:
a first inverter connected between the first node and a fifth node;
a second inverter connected between the third node and the fifth node; and
a plurality of third inverters connected between the fifth node and the fourth node in a row,
wherein the first clock signal is applied to the first node, the second clock signal is applied to the third node and a first signal is output through the fourth node.

4. The phase mixing device as claimed in claim 3, further comprising a control signal generation unit for determining enable/disable of the inverters of the first and second inverter groups, wherein the second control signal is applied to the control signal generation unit and each inverter of the third inverter group is enabled/disabled according to the first control signal.

5. The phase mixing device as claimed in claim 4, wherein the first inverter connected between the first node and the fifth node and the second inverter connected between the third node and the fifth node are selectively enabled by means of an output signal of the control signal generation unit.

6. The phase mixing device as claimed in claim 1, further comprising a control unit configured to generate the first and second control signals for controlling the mixing ratio of the first and second mixing units based on a duty ratio of a signal output from the output terminals of the first and second mixing units until the signal output from the output terminals of the first and second mixing units has a predetermined duty cycle.

* * * * *